United States Patent [19]

Clark

[11] 4,070,077
[45] Jan. 24, 1978

[54] CIRCUIT BOARD EYELET

[75] Inventor: Stephen Larry Clark, Rossville, Pa.

[73] Assignee: E. I. Du Pont de Nemours and Company, Wilmington, Del.

[21] Appl. No.: 691,765

[22] Filed: June 1, 1976

[51] Int. Cl.² .............................................. H05K 1/02
[52] U.S. Cl. ............................... 339/17 C; 339/275 B
[58] Field of Search .............. 339/17 R, 17 C, 256 R, 339/258 R, 258 A, 275 R, 275 B; 174/68.5

[56] References Cited

U.S. PATENT DOCUMENTS

| 3,538,491 | 11/1970 | Longenecker et al. | 339/256 R |
|---|---|---|---|
| 3,631,373 | 12/1971 | Martrisian | 339/17 C |
| 3,654,583 | 4/1972 | Mancini | 339/17 C |
| 3,681,738 | 8/1972 | Friend | 339/275 B |

Primary Examiner—Roy Lake
Assistant Examiner—Neil Abrams

[57] ABSTRACT

A circuit board eyelet is provided for flexibly interconnecting conductive patterns on opposite surfaces of a circuit board. The eyelet comprises a flanged end, an annular body and a plurality of staking legs. The annular body is double walled and has an annular solder flow channel between the walls. The solder flow channel communicates between the staking legs and the flanged end. A solder resist layer or an elastomeric plug in the interior of the body prevents the eyelet from filling with solder, and an annulet in the walls of the annular body provides for flexing of the eyelet connecting conductive patterns through a hole in the circuit board.

14 Claims, 8 Drawing Figures

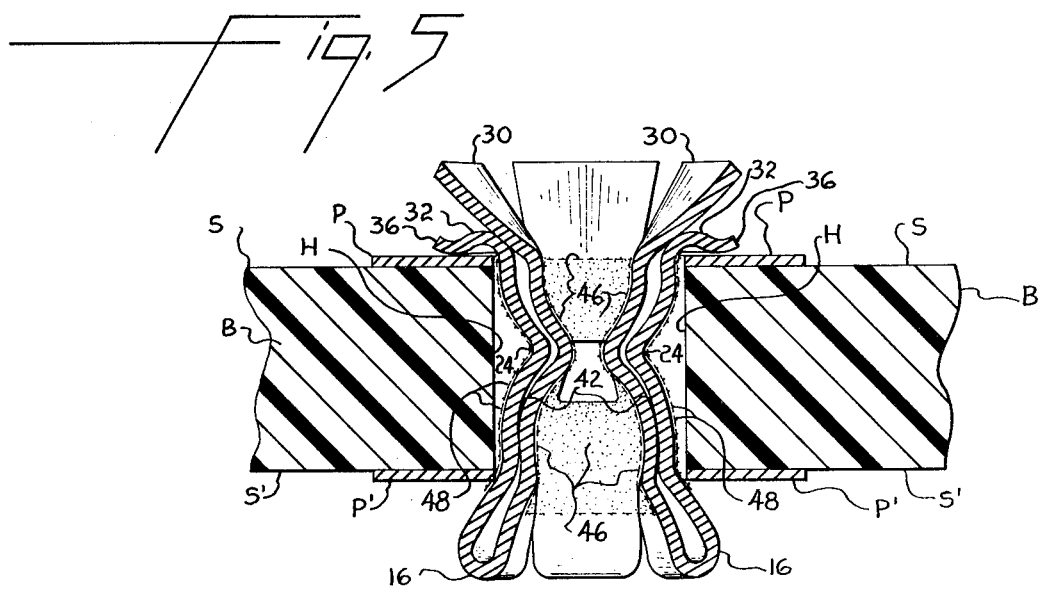
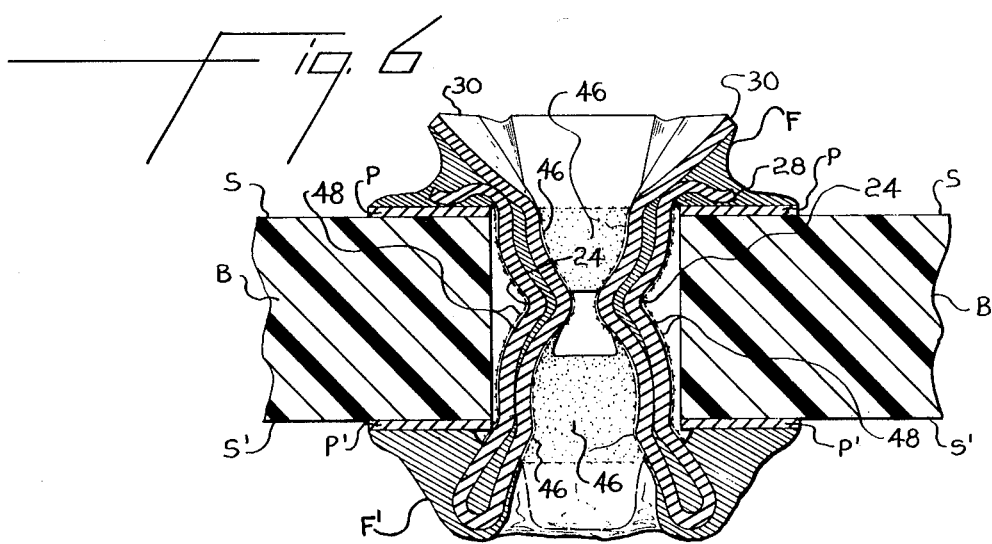

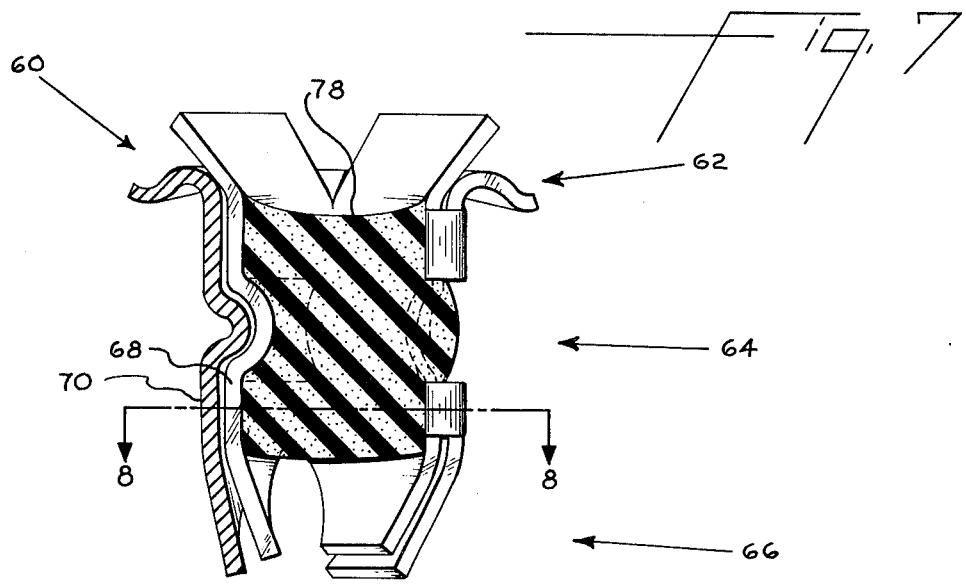
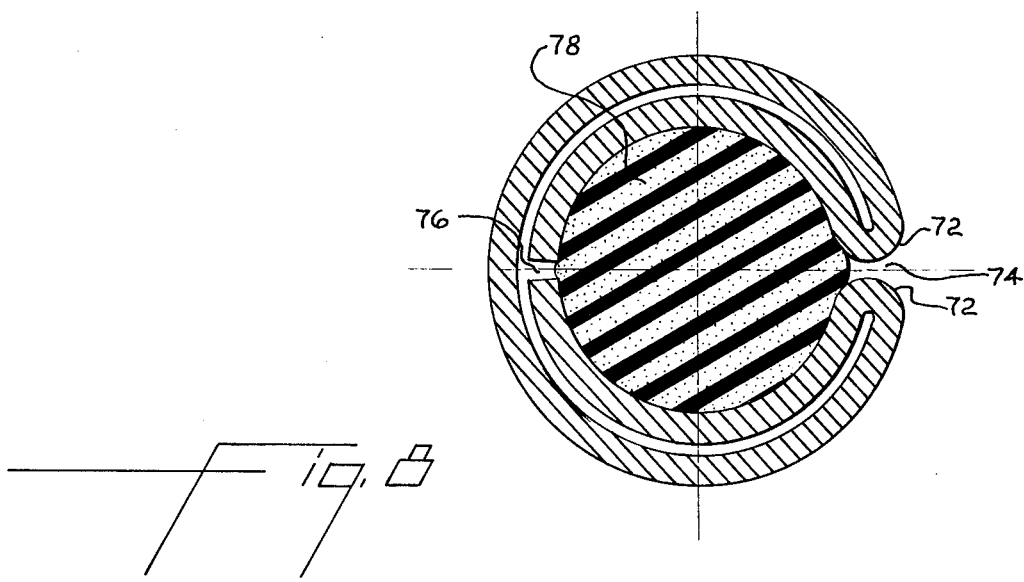

CIRCUIT BOARD EYELET

BACKGROUND OF THE INVENTION

Field of the Invention: The present invention relates to circuit board eyelets and particularly relates to circuit board eyelets for flexibly interconnecting electrical circuitry on opposite surfaces of a circuit board through a hole in the circuit board.

Description of the Prior Art: Circuit boards having conductive patterns on opposite surfaces thereof are well-known in the electronics packaging arts. Through-hole connectors for flexibly interconnecting such conductive patterns on opposite surfaces of a circuit board are described in U.S. Pat. Nos. 2,966,652; 3,268,652; 3,361,869; 3,452,149; 3,484,935 and 3,846,743. All of the above patents are directed to the problem of providing a flexible through hole connector. A flexible connector is required to prevent thermal cycling of the printed circuit board during manufacture and use from stressing and fracturing the soldered connections to the conductive patterns on opposite surfaces of the circuit board. In addition to the flexible connectors described in the above-mentioned patents, eyelet connectors have also been used for connecting conductive patterns on opposite surfaces of circuit boards. Eyelet connectors are described in U.S. Pat. Nos. 3,368,188; 3,504,328; 3,601,786 and 3,654,583. These eyelet connectors comprise a flanged end, an annular body and a plurality of staking legs. Although the flange in such eyelets has been adapted to provide improved resistance to stress failure of the soldered connection on opposite surfaces of a circuit board, the annular body is substantially rigid and does not provide a truly flexible through hole connector. However, the truly flexible through hole connectors described in the afore-mentioned patents have been impractical and unsatisfactory for various reasons, e.g. due to the cost of materials, the requirement for expensive and complicated fabrication apparatus, complicated assembly steps requiring extensive manual labor and the lack of readily available machines for applying the connectors to a circuit board.

SUMMARY OF THE INVENTION

According to the present invention, an eyelet for flexibly interconnecting conductive patterns on opposite surfaces of a circuit board is provided. The eyelet comprises a flanged end, an annular body connected to the flanged end, and a plurality of staking legs extending from the annular body. The annular body is double-walled having an annular solder flow channel between the walls and communicating between the staking legs and the flanged end of the eyelet. An annulet is formed in the annular body between the staking legs and the flanged end. A layer of solder resist or elastomeric plug is adhered to the interior of the annular body.

The eyelet of the present invention provides a truly flexible eyelet type through board connector that may be applied to a circuit board using commercially available eyelet application machines.

DESCRIPTION OF THE DRAWINGS

FIG. 5 is an elevation view of the embodiment of FIG. 1 staked in a hole in a circuit board.

FIG. 6 is an elevation view similar to FIG. 5 with the eyelet soldered in the hole in the circuit board.

FIG. 7 is an elevation view in section of an alternate embodiment of an eyelet according to the invention.

FIG. 8 is a section view taken along line 8—8 of FIG. 7.

DESCRIPTION OF THE PREFERRED EMBODIMENTS

Figure 1:
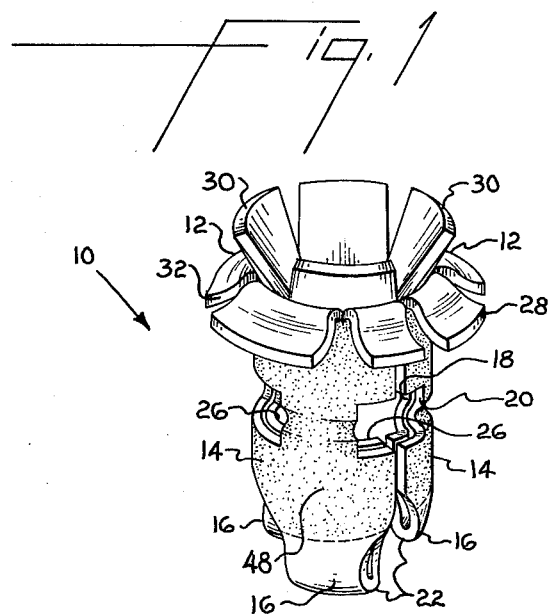
FIG. 1 is a perspective view of an embodiment of an eyelet of the invention.
Figure 2:
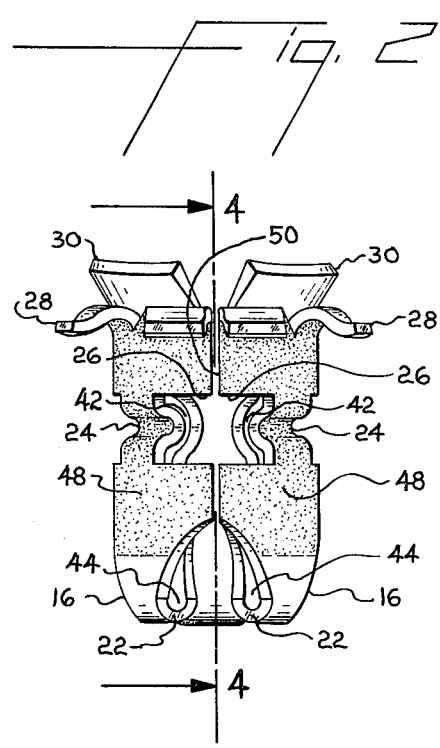
FIG. 2 is an elevation view of the embodiment of FIG. 1.
Figure 3:
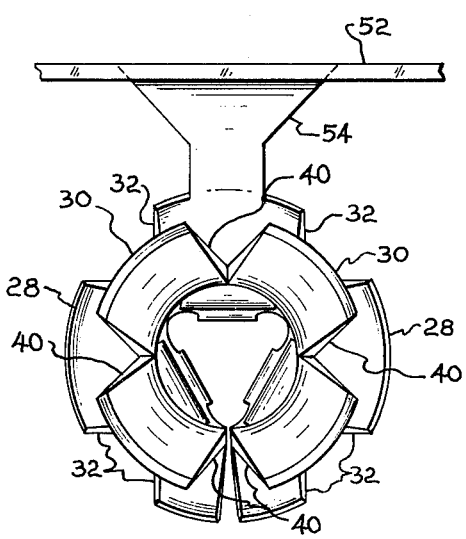
FIG. 3 is a top view of the embodiment of FIG. 1.
Figure 4:
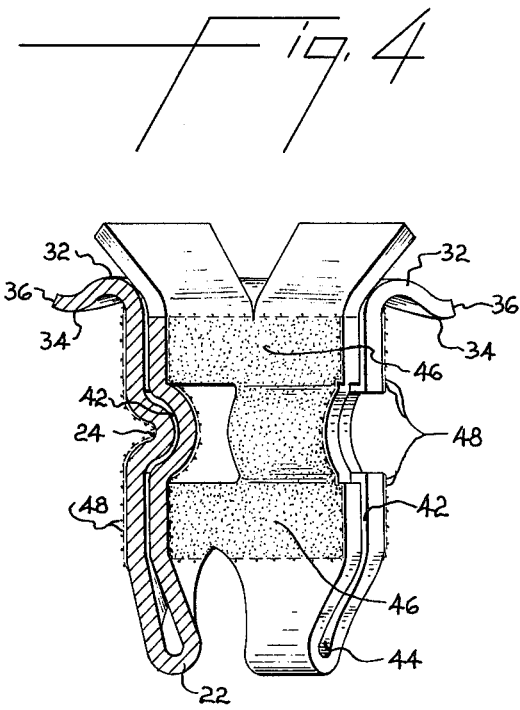
FIG. 4 is a section view along line 4—4 of FIG. 2.

A preferred embodiment of an eyelet 10 is described below with reference to the attached drawings wherein the same numerals are used throughout to identify the same elements.

The eyelet 10 comprises a flanged end 12, an annular body 14 and a plurality of staking legs 16. The annular body 14 is of double-walled construction having an interior wall 18 and an outer wall 20. The interior wall 18 is joined with the outer wall 20 by a bight 22 at the end of each staking leg 16. An annulet 24 is formed in the interior wall 18 and outer wall 20 of the annular body 12 between the flanged end 12 and the staking legs 16. Circumferentially spaced windows 26 are formed in the outer wall 20 and interior wall 18 of the annular body coincident with the annulet 24. The flanged end 12 of the eyelet 10 includes an outer flange 28 joined to the outer wall 20 and an inner flange 30 joined to the interior wall 18. The outer flange 28 includes a plurality of V-shaped slits 32 axially spaced around the flange 28. The flange 28 includes a flared segment 32, a seating segment 34, and a flared end segment 36. The seating segment 34 is substantially perpendicular to the outer wall 20 of the annular body 14. The inner flange 30 includes a plurality of V-shaped slits 40, and the flange 30 extends from the interior wall 18 of the annular body 14 at an angle of substantially 45°. The V-shaped slits 40 in the inner flange 30 are alternately spaced with respect to the V-shaped slits 32 of the outer flange. An annular solder channel 42 extends the length of the annular body 14 between the interior wall 18 and the outer wall 20. A pair of solder entry orifices 44 is provided on each of the staking legs 16. A solder resist layer 46 is adhered to the interior wall 18 of the annular body 14, and a solder resist layer 48 is adhered to the outer wall 20 of the annular body 14.

The eyelet 10 may be fabricated by die stamping and includes a seam 50 extending along the length of the body 14. A plurality of the eyelets 10 may be attached to a carrier strip 52 through a cut off section 54. The eyelets 10 may be staked in a circuit board using the machines described in Bulletin 301 of Berg Electronics Division, E. I. du Pont de Nemours and Company, New Cumberland, Pennsylvania.

An eyelet 10 is staked in a non-plated hole H in a circuit board B having conductive patterns P, P' on respective surfaces S, S'. The eyelet 10 is inserted in the hole H and the staking legs 16 are staked and flared outwardly to retain the eyelet 10 in the hole H. The eyelet 10 is then soldered e.g. by wave or dip soldering surface S' of the board B, and solder enters the solder orifices 44 on each staking leg. The solder is drawn by capillary attraction through the solder channel 42 of the annular body 14 to the flanged end 12 of the eyelet 10. The solder flows outward of the outer flange 28 through the V-shaped slits 32 under the flared segments 34 and around the flared ends 36 of the flange 28. The inner flange 30 extending from the interior wall 18 of the annular body directs the solder outwardly and prevents it from flowing into the interior of the annular body 14. The solder resist layers 46, 48 on the annular body repel any solder from the interior wall 18 of the body 14 and the outer wall 20 of the body 14 and hole H. The solder is cooled to form fillets F and F', respectively, between the flanged end 12 of the eyelet 10 and conductive pattern P and the staking legs 16 and the conductive pattern P'. The annular body 14 having the solder resist layers adherent thereto and the annulet 24 having windows 26 formed therein flexibly interconnect the conductive layers P, P' on surfaces S, S' of the board B. When the thickness of the board B thermally contracts after soldering the walls 18 and 20 of the annular body 14 of the eyelet tend to flex at the annulet 24 inwardly in the hole H. Since the interior of the annular body 14 is free of solder, it may readily flex. Additionally, the windows 26 reduce the force required for flexing of the annular body without exerting substantial stress between the solder connections F, F' and the conductive patterns P, P' on the surfaces of the board B.

The eyelet 10 may be stamped formed from a suitable strip of metal, e.g. phosphor/bronze, brass, or copper. The solder resist layer may be a metal plating, e.g. chromium, or an organic coating, e.g. Dynachem Solder Mask 783 available from Dynachem Corporation, Santa Fe Spring, California.

An alternate embodiment of an eyelet 60 according to the invention is illustrated in FIGS. 7 and 8. Eyelet 60 comprises a flanged end 62, an annular body 64 and a plurality of staking legs 66. The annular body 64 is of double-walled construction having an interior wall 68 and an outer wall 70. The interior wall 68 is joined with the outer wall by reverse bends 72 at a longitudinal seam 74 of body 64. The interior wall 68 includes a seam 76 diametrically opposite seam 74 of body 64.

A resilient elastomeric plug 78, e.g. a room temperature vulcanizing silicon rubber, is adhered to the interior of the annular body 64 of the eyelet 60. The elastomeric plug cures and prevents the interior of the body 64 from filling with solder and permits flexing of the body 64 at the annulet during thermal cycling of a circuit board. In the event the eyelet 60 is to be used in a plated through circuit board hole a layer of solder resist may be adhered to the outer wall of the body 64 similar to eyelet 10. This prevents solder from filling the space between the annulet and a plated hole and insures the body will flex during thermal cycling.

What is claimed is:

1. An eyelet for flexibly interconnecting conductive patterns on opposite surfaces of a circuit board comprising a flanged end, an annular body connected to said flanged end, and a plurality of staking legs extending from said annular body, said body having spaced inner and outer walls presenting an annular solder flow channel between said staking legs and said flanged end, an annulet formed therein between said staking legs and said flanged end and a layer of solder resist adherent the interior of said inner wall.

2. An eyelet, according to claim 1, said annular body including a plurality of circumferentially spaced windows coincident said annulet.

3. An eyelet, according to claim 1, said walls being joined at a bight at the end of at least one staking leg.

4. An eyelet, according to claim 1, said flanged end comprising an outer flange connected to the outer wall of said annular body and an inner flange connected to the inner wall of said annular body, said outer flange including segments substantially perpendicular with said annular body and said inner flange extending from said annular body at a substantially 45° angle.

5. An eyelet, according to claim 4, said outer flange being curved along its length and including a plurality of axially spaced V-shaped slits.

6. An eyelet, according to claim 5, said inner flange including a plurality of axially spaced V-shaped slits, said slits in said inner flange being alternately spaced with respect to said slits in the outer flange.

7. An eyelet, according to claim 1, said walls being joined at reverse bends along a longitudinal seam of said annular body.

8. An eyelet for flexibly interconnecting conductive patterns on opposite sides of a circuit board comprising a flanged end, an annular body connected to said flanged end, and a plurality of staking legs extending from said annular body, said body having spaced inner and outer walls presenting an annular solder flow channel between said staking legs and said flanged end, an annulet formed therein between said staking legs and said flanged end, and an elastomeric plug adherent the interior of said body.

9. An eyelet, according to claim 8, said annular body including a plurality of circumferentially spaced windows coincident said annulet.

10. An eyelet, according to claim 8, said walls being joined at a bight at the end of at least one staking leg.

11. An eyelet, according to claim 8, said flanged end comprising an outer flange connected to the outer wall of said annular body and an inner flange connected to the inner wall of said annular body, said outer flange including segments substantially perpendicular with said annular body and said inner flange extending from said annular body at a substantially 45° angle.

12. An eyelet, according to claim 8, said outer flange being curved along its length and including a plurality of axially spaced V-shaped slits.

13. An eyelet, according to claim 12, said inner flange including a plurality of axially spaced V-shaped slits said slits in said inner flange being alternately spaced with respect to said slits in the outer flange.

14. An eyelet, according to claim 8, said walls being joined at reverse bends along a longitudinal seam of said annular body.

* * * * *